(12) United States Patent
Lin et al.

(10) Patent No.: US 10,424,593 B2
(45) Date of Patent: Sep. 24, 2019

(54) THREE-DIMENSIONAL NON-VOLATILE MEMORY AND MANUFACTURING METHOD THEREOF

(71) Applicant: MACRONIX International Co., Ltd., Hsinchu (TW)

(72) Inventors: I-Ting Lin, Hsinchu (TW); Yuan-Chieh Chiu, Hsinchu County (TW); Hong-Ji Lee, Taoyuan (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/866,132

(22) Filed: Jan. 9, 2018

(65) Prior Publication Data

US 2019/0214402 A1  Jul. 11, 2019

(51) Int. Cl.
| | | |
|---|---|---|
| *H01L 27/11578* | (2017.01) |
| *G11C 14/00* | (2006.01) |
| *G11C 16/04* | (2006.01) |
| *H01L 21/28* | (2006.01) |
| *H01L 27/1157* | (2017.01) |
| *G11C 16/34* | (2006.01) |
| *G11C 11/56* | (2006.01) |

(52) U.S. Cl.
CPC .... *H01L 27/11578* (2013.01); *G11C 11/5671* (2013.01); *G11C 14/0018* (2013.01); *G11C 16/0466* (2013.01); *G11C 16/3422* (2013.01); *H01L 21/28282* (2013.01); *H01L 27/1157* (2013.01)

(58) Field of Classification Search
CPC ......... H01L 27/11563; H01L 27/11568; H01L 27/1157; H01L 27/11578; H01L 27/1158; H01L 27/11582
See application file for complete search history.

(56) References Cited

U.S. PATENT DOCUMENTS

| | | |
|---|---|---|
| 8,546,218 B2 | 10/2013 | Kim et al. |
| 9,040,415 B2 | 5/2015 | Park et al. |
| 9,559,113 B2 | 1/2017 | Lai |
| 9,646,975 B2 | 5/2017 | Peri et al. |
| 9,728,551 B1 | 8/2017 | Lu et al. |
| 9,953,997 B2 * | 4/2018 | Park ................. H01L 27/11582 |

(Continued)

OTHER PUBLICATIONS

"Office Action of Taiwan Counterpart Application," dated Jul. 12, 2018, pp. 1-6.

*Primary Examiner* — Allison Bernstein
(74) *Attorney, Agent, or Firm* — J.C. Patents

(57) ABSTRACT

A three-dimensional non-volatile memory and a method of manufacturing the same are provided. The three-dimensional non-volatile memory includes a substrate, a charge storage structure, a stacked structure and a channel layer. The charge storage structure is disposed on the substrate. The stacked structure is disposed at a side of the charge storage structure and includes insulating layers, gates, a buffer layer and a barrier layer. The insulating layers and the gates are alternately stacked. The buffer layer is disposed between each of the gates and the charge storage structure and on the surfaces of the insulating layers. The barrier layer is disposed between each of the gates and the buffer layer. An end of the gate is convex with respect to an end of the barrier layer in a direction away from the channel layer.

19 Claims, 13 Drawing Sheets

(56) References Cited

U.S. PATENT DOCUMENTS

| | | | |
|---|---|---|---|
| 9,960,171 B2* | 5/2018 | Kanamori | H01L 27/11519 |
| 2011/0303971 A1* | 12/2011 | Lee | H01L 27/11551 |
| | | | 257/324 |
| 2013/0093005 A1 | 4/2013 | Yun et al. | |
| 2015/0171098 A1 | 6/2015 | Simsek-Ege et al. | |
| 2016/0351497 A1 | 12/2016 | Peri et al. | |
| 2017/0092733 A1 | 3/2017 | Makala et al. | |
| 2018/0033646 A1* | 2/2018 | Sharangpani | H01L 27/1157 |

* cited by examiner

THREE-DIMENSIONAL NON-VOLATILE MEMORY AND MANUFACTURING METHOD THEREOF

BACKGROUND OF THE INVENTION

1. Field of the Invention

The invention relates to a memory and a manufacturing method of the memory, and particularly relates to a three-dimensional non-volatile memory and a manufacturing method of the three-dimensional non-volatile memory.

2. Description of Related Art

Non-volatile memory devices (e.g., flash memory) have the characteristics that data stored therein are safeguarded even after power is turned off. Thus, non-volatile memory devices are commonly adopted in personal computers and other electronic devices.

Flash memory arrays commonly used in the industry includes NOR flash memories and an NAND flash memories. Since memory cells are connected in series in the structure of the NAND flash memory, the level of integration and the area utilization of the NAND flash memory are more effective than those of the NOR flash memory. As the results, the memory density of NAND flash memory is much larger than NOR flash memory. Therefore, NAND memories have been widely used in various electronic products, especially for mass data storage field.

In order to further increase the level of storage density as well as integration of memory devices, a three-dimensional NAND flash memory device has been developed. However, currently, when a three-dimensional NAND flash memory is operating, interference of memory cells is one of the major challenges in three-dimensional NAND flash memory, especially there is trace amounts of residue.

SUMMARY OF THE INVENTION

The invention provides a three-dimensional non-volatile memory and a manufacturing method of the three-dimensional non-volatile memory capable of eliminating interferences such as electric connection/bridge between gates during operation.

An embodiment of the invention provides a three-dimensional non-volatile memory. The three-dimensional non-volatile memory includes a substrate, a charge storage structure, a stacked structure, and a channel layer. The charge storage structure is disposed on the substrate. The stacked structure is disposed at a side of the charge storage structure and includes insulating layers, gates, a buffer layer and a barrier layer. The insulating layers and the gates are alternately stacked. The buffer layer is disposed between each of the gates and the charge storage structure and on the surfaces of the insulating layers. The barrier layer is disposed between each of the gates and the buffer layer. The channel layer is disposed at another side of the charge storage structure. An end of the gate is convex with respect to an end of the barrier layer in a direction away from the channel layer.

According to some embodiments of the invention, a distance from the end of the insulating layer to the end of the gate in a direction perpendicular to the channel layer is L1, a distance from the end of the insulating layer to the end of the barrier layer in a direction perpendicular to the channel layer is L2, and 1<L2/L1<2.

According to some embodiments of the invention, a thickness of a first portion of the buffer layer contacting the barrier layer is T1, a thickness of a second portion of the buffer layer not contacting the barrier layer is T2, and 0<T1−T2≤30 Å.

According to some embodiments of the invention, the second portion of the buffer layer is discontinuous.

According to some embodiments of the invention, an atomic concentration of atoms of the barrier layer contained in the second portion is less than 1 at %.

According to some embodiments of the invention, a material of the barrier layer comprises Ti, TiN, Ta, TaN, or a combination thereof, for example.

According to some embodiments of the invention, a material of the buffer layer includes a high-k material, for example.

An embodiment of the invention provides a manufacturing method of a three-dimensional non-volatile memory, including the following. A charge storage structure and a stacked structure are formed on a substrate. The charge storage structure is disposed on a sidewall of the stacked structure. The stacked structure includes: a plurality of insulating layers, a plurality of gates, a buffer layer, and a barrier layer. The insulating layers and the gates are alternately stacked. The buffer layer is disposed between each of the gates and the charge storage structure and on the surfaces of the insulating layers. The barrier layer is disposed between each of the gates and the buffer layer. A channel layer is formed on the charge storage structure. An end of the gate is convex with respect to an end of the barrier layer in a direction away from the channel layer.

According to some embodiments of the invention, a distance from the end of the insulating layer to the end of the gate in a direction perpendicular to the channel layer is L1, a distance from the end of the insulating layer to the end of the barrier layer in a direction perpendicular to the channel layer is L2, and 1<L2/L1<2.

According to some embodiments of the invention, a thickness of a first portion of the buffer layer contacting the barrier layer is T1, a thickness of a second portion of the buffer layer not contacting the barrier layer is T2, and 0<T1−T2<30 Å.

According to some embodiments of the invention, the second portion of the buffer layer is discontinuous.

According to some embodiments of the invention, an atomic concentration of atoms of the barrier layer contained in the second portion is less than 1 at %.

According to some embodiments of the invention, the step of forming the stacked structure includes the following. A plurality of insulating material layers and a plurality of sacrifice layers alternately stacked are formed on the substrate. A patterning process is performed on the insulating material layers and the sacrifice layers to form a first opening. The sacrifice layers exposed by the first opening are removed to form a second opening exposing a portion of the charge storage structure. A gate layer is formed on a surface of the first opening and filled into the second opening. The gate layer includes a buffer material layer, a barrier material layer, and a gate material layer sequentially formed. A portion of the gate material layer, a portion of the buffer material layer, and a portion of the barrier material layer are removed to form the gates, the buffer layer, and the barrier layer.

According to some embodiments of the invention, the step of removing the portion of the gate material layer, the portion of the barrier material layer, and the portion of the buffer material layer includes the following. A first etching process is performed to remove the portion of the gate material layer, thereby exposing the barrier material layer. A second etching process is performed to remove the portion of the barrier material layer, thereby exposing the buffer material layer. A third etching process is performed to remove the portion of the buffer material layer, thereby forming the buffer layer.

According to some embodiments of the invention, the first etching process includes an etch back process, for example.

According to some embodiments of the invention, the second etching process includes a dry etching process or a wet etching process, for example.

According to some embodiments of the invention, the third etching process includes alternately performing a dry process and a wet process, for example.

According to some embodiments of the invention, the dry process includes a plasma process, for example.

According to some embodiments of the invention, the wet process includes a wet process with a fluorine-containing solvent as an etchant.

Based on the above, in the three-dimensional non-volatile memory and the manufacturing method of the three-dimensional non-volatile memory according to the embodiments of the invention, a portion of the insulating layer between the gates and the stringer in the insulating layer are removed together to greatly reduce the interferences such as metal residues between the gates and a short circuit during operation.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A, 1B, 1B-1, 1C to 1I are cross-sectional views illustrating a manufacturing process of a three-dimensional non-volatile memory according to some embodiments of the invention.

DESCRIPTION OF THE EMBODIMENTS

Figure 1A:
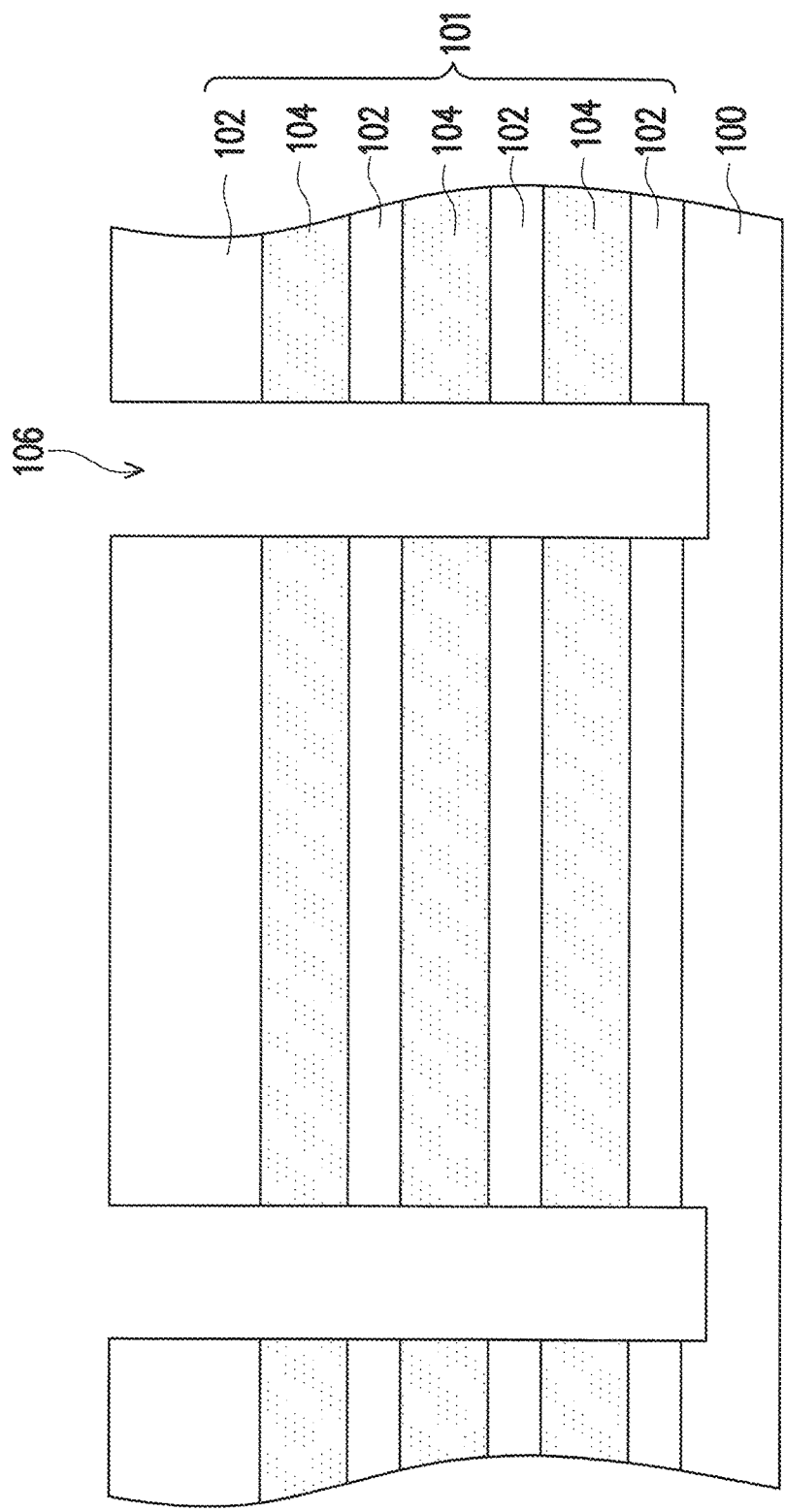

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1I are cross-sectional views illustrating a manufacturing process of a three-dimensional non-volatile memory according to some embodiments of the invention. FIG. 2 is a top view of FIG. 1B.

Figure 2:
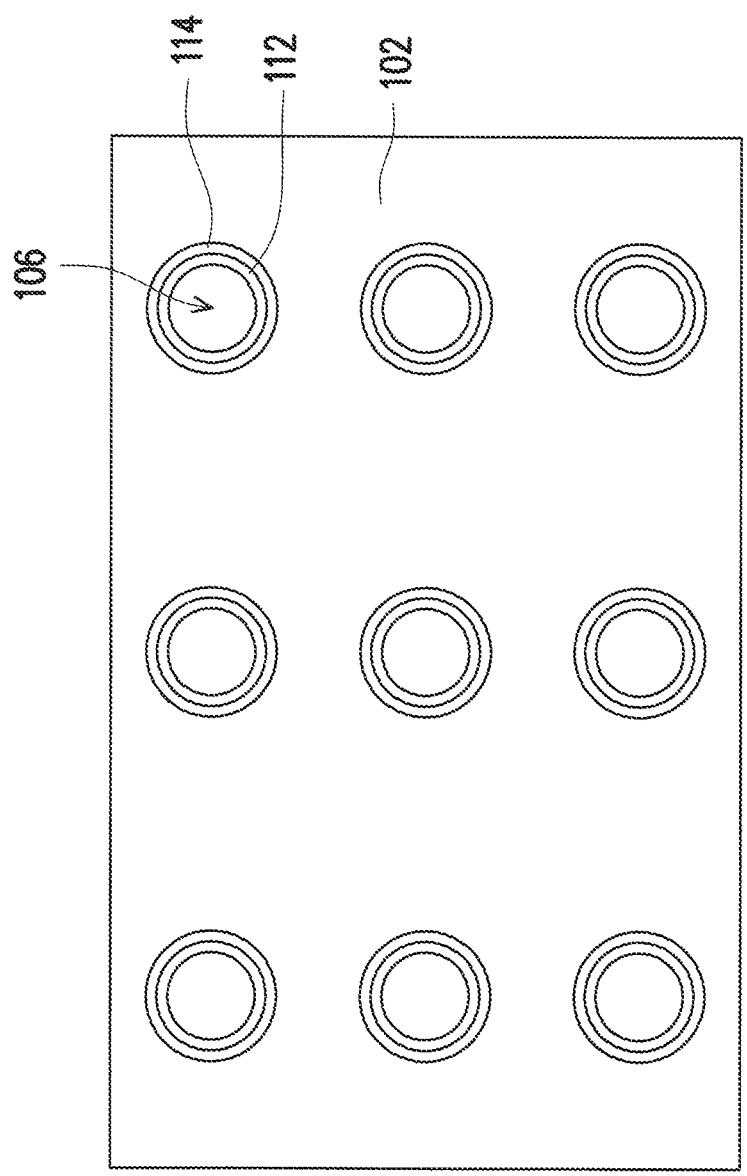
FIG. 2 is a top view of FIG. 1B.

Referring to FIG. 1A, a stacked structure 101 is formed on a substrate 100. The substrate 100 is a silicon substrate, for example. In some embodiments, a doped region (e.g., an N+ doped region, not shown) may be formed in the substrate 100 based on design requirements. The stacked structure 101 includes a plurality of insulating material layers 102 and a plurality of sacrifice layers 104 alternately stacked. A material of the insulating material layer 102 includes a dielectric material, such as silicon oxide. A material of the sacrifice layer 104 is different from the insulating material layer 102 and exhibits a sufficient etching selectivity with respect to the insulating material layer 102. Except for the above, no specific limitation is imposed on the material of the sacrifice layer 104. In some embodiments, the material of the sacrifice layer 104 includes silicon nitride, for example. The insulating material layers 102 and the sacrifice layers 104 are formed by performing a plurality of chemical vapor deposition (CVD) processes, for example. The number of layers of the insulating material layers 102 and the number of layers of the sacrifice layers 104 in the stacked structure 101 may is more than 16. However, the invention is not limited thereto. The numbers of layers of the insulating material layers 102 and the sacrifice layers 104 may be determined by the design and the density of a memory device.

Then, an etching process is performed on the stacked structure 101 to form an opening 106 penetrating through the stacked structure 101. In some embodiments, in the etching process, a portion of the substrate 100 may be optionally removed to extend the opening 106 into the substrate 100. The opening 106 is a hole, for example, as shown in FIG. 2.

Figure 1B:
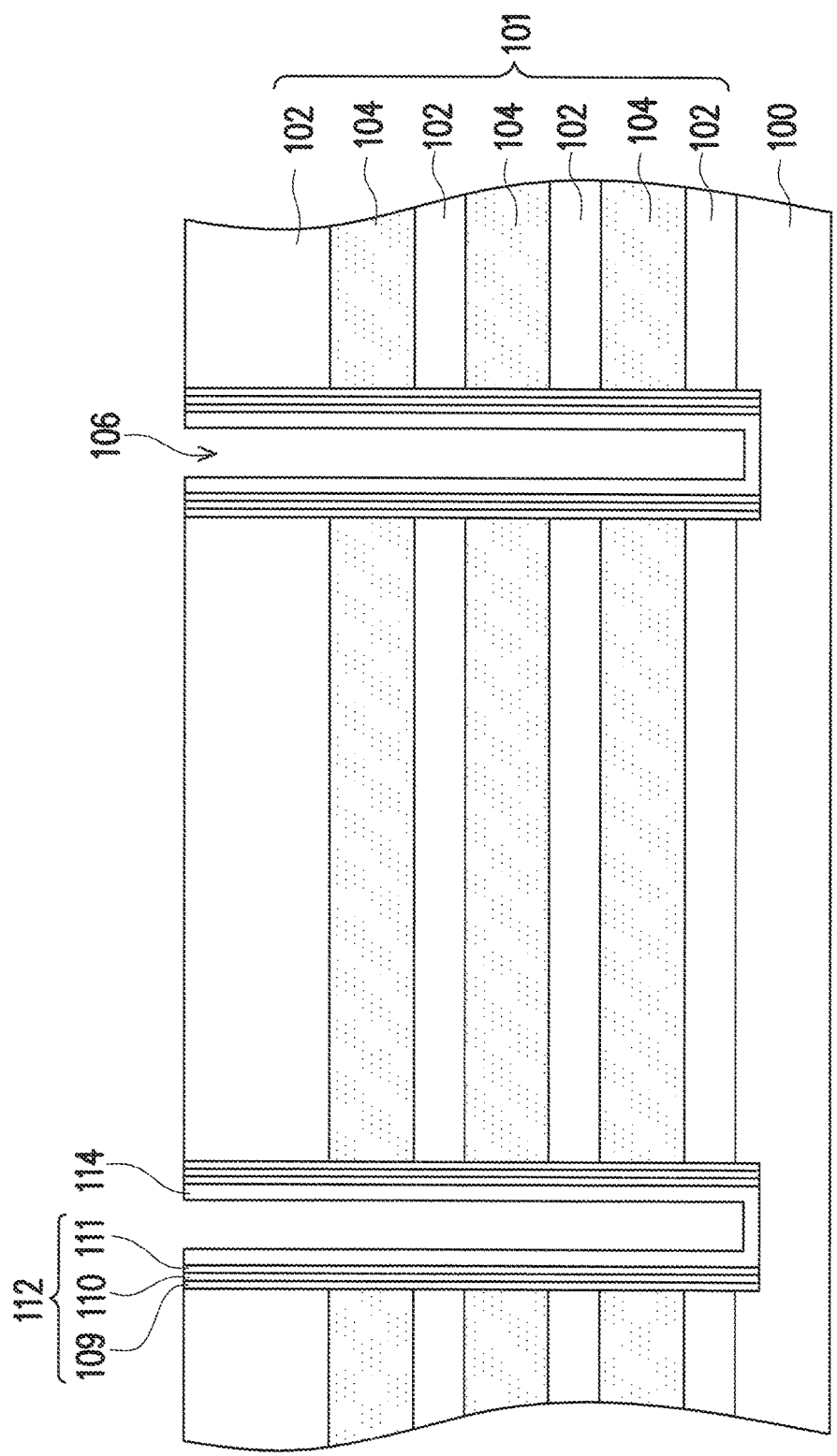
Figures 1, 1B:
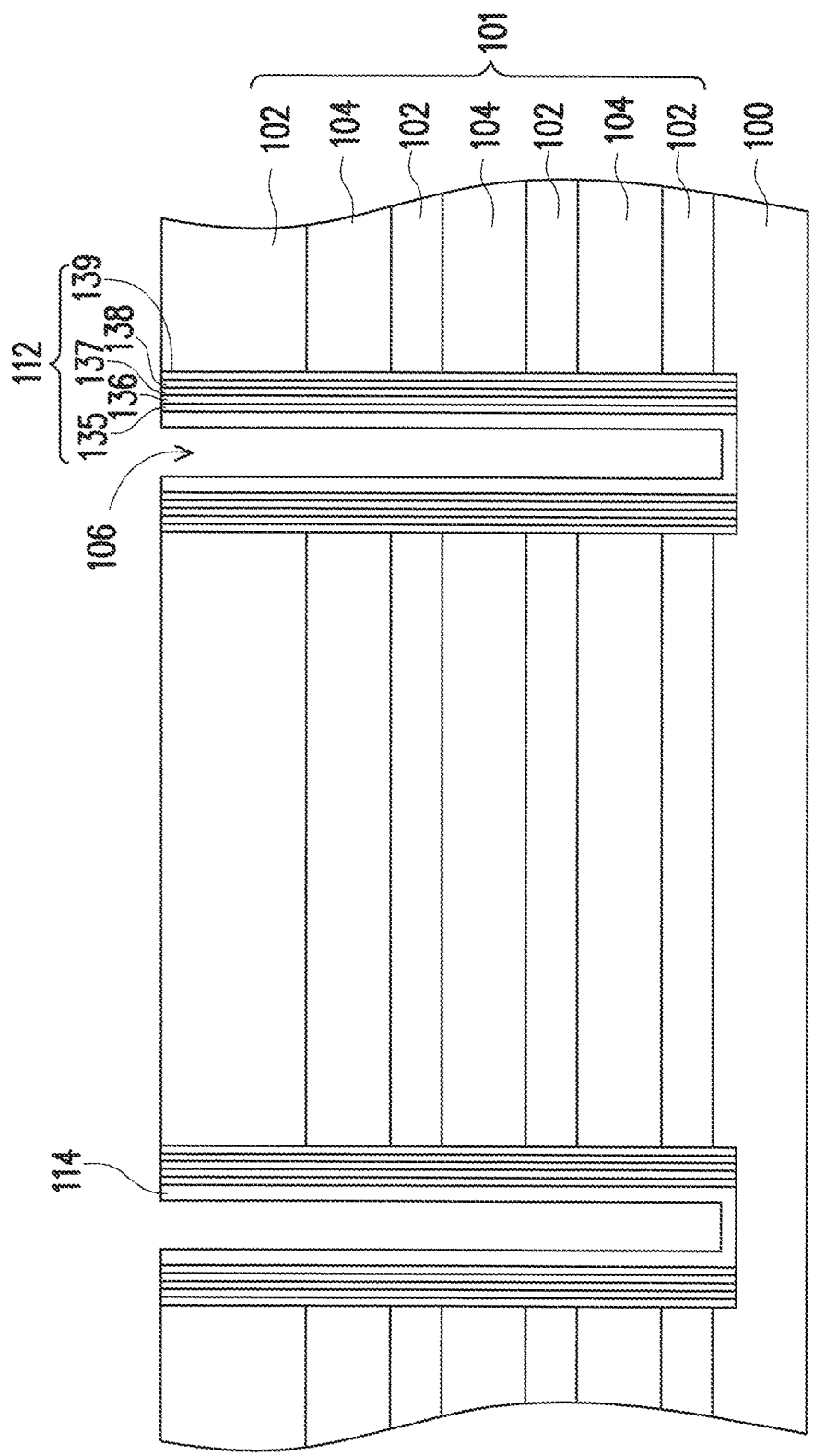

Referring to FIGS. 1B and 2, a charge storage structure 112 is formed on a sidewall of the opening 106. The charge storage structure 112 covers the insulating material layers 102 and the sacrifice layers 104. The charge storage structure 112 may be an oxide, a nitride, or a combination thereof. In some embodiments, the charge storage structure 112 includes an oxide-nitride-oxide (ONO) composite layer. In an exemplary embodiment, the charge storage structure 112 includes a silicon oxide layer 109, a silicon nitride layer 110, and a silicon oxide layer 111. In some embodiments, the charge storage structure 112 includes an oxide-nitride-oxide-nitride-oxide (ONONO) composite layer. In an exemplary embodiment, the charge storage structure 112 includes a silicon oxide layer 135, a silicon nitride layer 136, a silicon oxide layer 137, a silicon nitride layer 138, and a silicon oxide layer 139, as shown in FIG. 1B-1. More specifically, the charge storage structure 112 is formed on the sidewall of the opening 106 in a form of a spacer and exposes the substrate 100 at a bottom surface of the opening 106.

In the present embodiment, the openings 106 in FIG. 2 are arrayed, but the present invention is not limited thereto. In some embodiments, the openings 106 are arranged as any possible regular patterns as long as the distance between the openings 106 is greater than 100 Å.

Figure 1C:
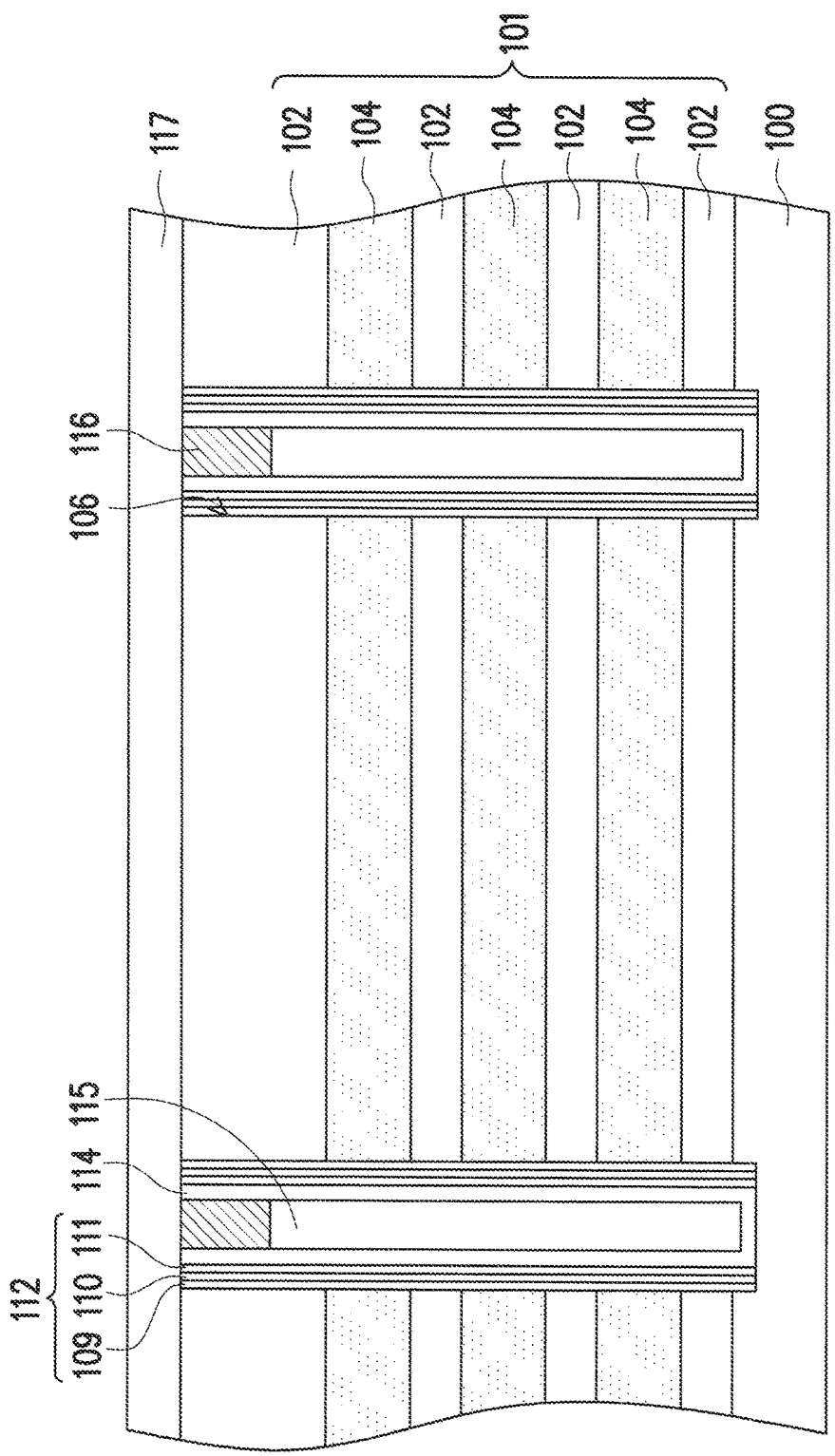

Then, a channel layer 114 is formed on the charge storage structure 112. Specifically, the channel layer 114 covers the charge storage structure 112 on the side surface of the opening 106 and contacts the substrate 100 exposed at the bottom surface of the opening 106. In some embodiments, the channel layer 114 may serve as a bit line. A material of the channel layer 114 includes a semiconductor material, such as polysilicon or doped polysilicon. Doping may be carried out by performing an in-situ doping process or performing an ion implantation process. Referring to FIG. 1C, a dielectric layer 115 is formed in the opening 106. A process of forming the dielectric layer 115 includes, for example, forming a dielectric material layer (not shown) filling the opening 106 by performing a chemical vapor deposition process or a spin coating process, and then performing an etch back process on the dielectric material layer, such that an upper surface of the dielectric layer 115 that is formed is lower than a top surface of the stacked structure 101.

Then, a conductive plug 116 is formed on the dielectric layer 115. The conductive plug 116 contacts the channel layer 114. In some embodiments, a material of the conductive plug 116 includes polysilicon or doped polysilicon, for example. A process of forming the conductive plug 116 includes, for example, forming a conductive material layer (not shown) filling the opening 106 and then performing a chemical mechanical polishing process and/or an etch back process on the conductive material layer to remove the conductive material layer outside the opening 106.

Afterwards, an insulating layer 117 is formed on the stacked structure 101. The insulating layer 117 covers the charge storage structure 112, the channel layer 114, the conductive plug 116, and the stacked structure 101. In some embodiments, a material of the insulating layer 117 includes silicon oxide, or other insulating materials, for example.

Figure 1D:
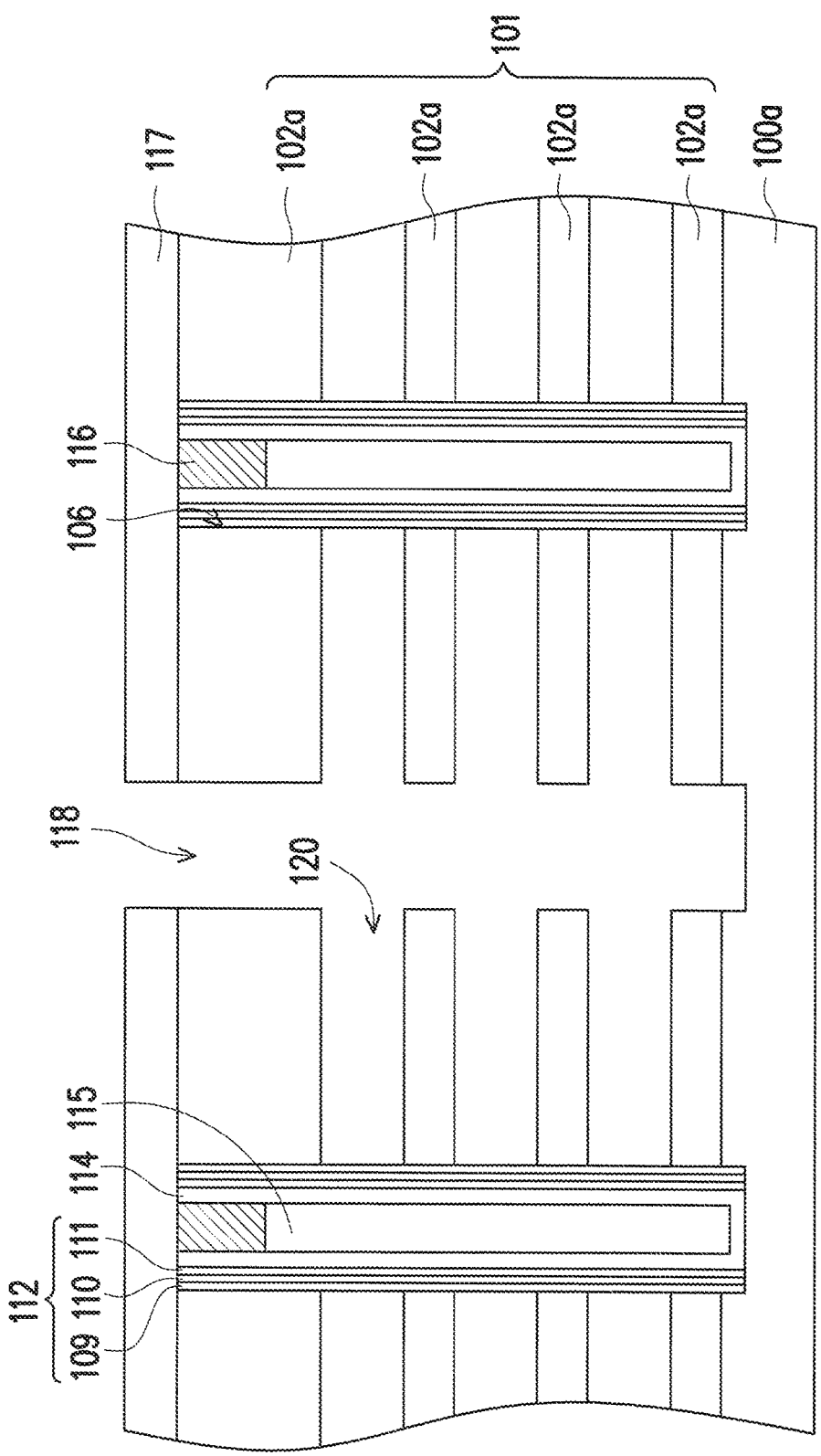

Referring to FIG. 1D, a patterning process is performed on the insulating layer 117, the insulating material layers 102, and the sacrifice layers 104 to form an opening (also referred to as a trench) 118 penetrating through the insulating layer 117, the insulating material layers 102, and the sacrifice layers 104. In some embodiments, during the patterning process, a portion of the substrate 100 may also be removed to extend the opening 118 into the substrate 100. Besides, after performing the patterning process on the insulating material layers 102, remaining of the insulating material layers 102 forms insulating layers 102a.

Then, the sacrifice layers 104 exposed by the opening 118 are removed to form sideway openings 120 exposing a portion of the charge storage structure 112. A process of removing the sacrifice layers 104 exposed by the opening 118 includes performing a dry etching process or a wet etching process, for example. Etchants used in the dry etching process includes $NF_3$, $H_2$, HBr, $O_2$, $N_2$, He for example. An etchant used in the wet etching process includes a $H_3PO_4$ solution, for example.

Figure 1E:
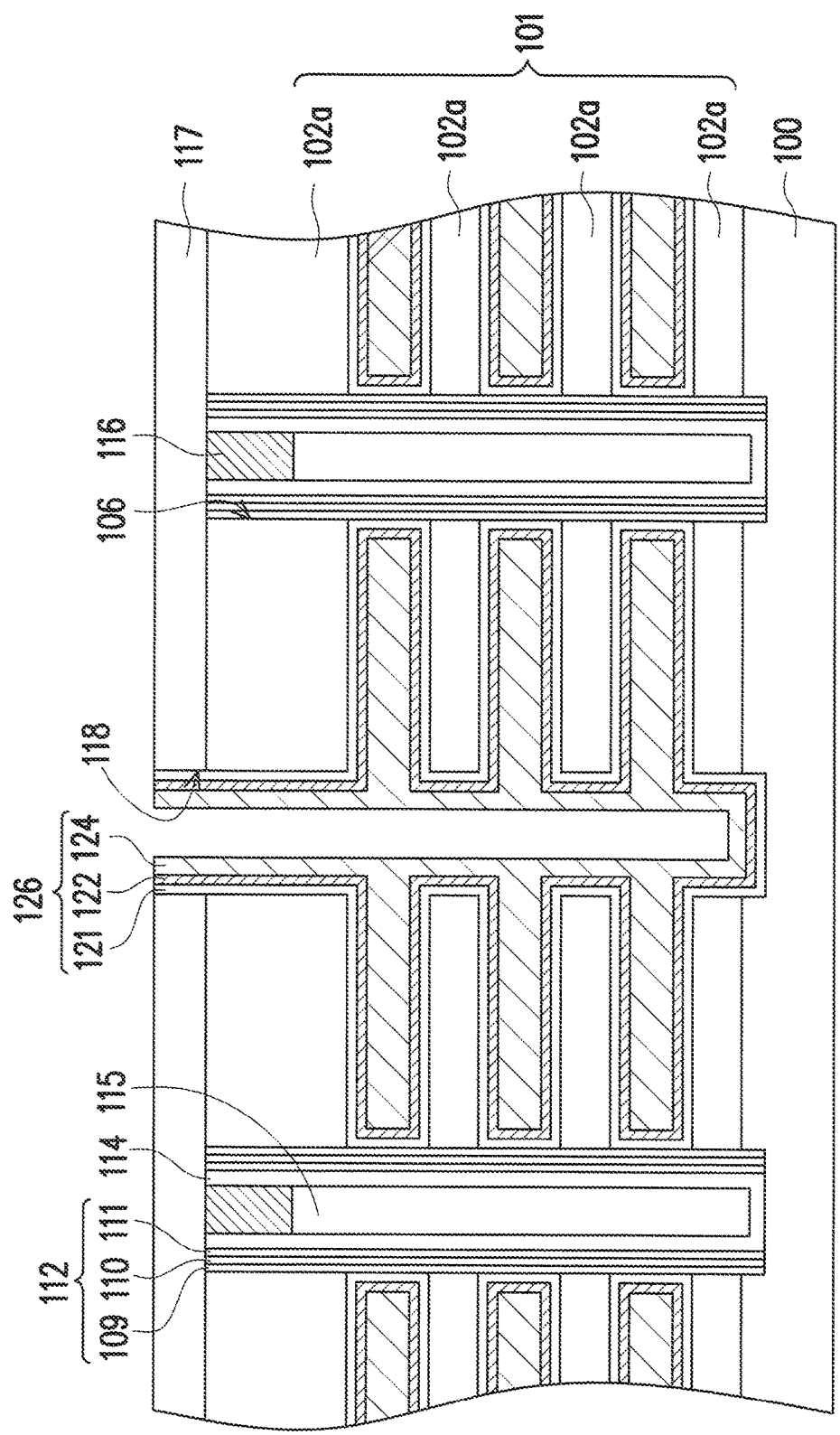

Referring to FIG. 1E, a gate layer 126 is formed on a surface of the opening 118. In addition, the gate layer 126 is filled into the sideway openings 120. The gate layer 126 includes a buffer material layer 121, a barrier material layer 122, and a gate conductive material layer 124. In some embodiments, the buffer material layer 121 is formed between the barrier material layer 122 and the charge storage structure 112 and on surfaces of the insulating layers 102a. A material of the buffer material layer 121 includes, for example, a high-k material having a dielectric constant greater than 7, such as $Al_2O_3$, $HfO_2$, $La_2O_5$, a transition metal oxide, lanthanide series oxide or a combination thereof, for example. A process of forming the buffer material layer 121 requires good step coverage, giving good film thickness uniformity over whole structures. It includes performing a chemical vapor deposition process or an atomic layer deposition (ALD) process, for example. The buffer material layer 121 may facilitate the erasing and program properties. A material of the barrier material layer 122 includes Ti, TiN, Ta, TaN, or a combination thereof, for example. A process of forming the barrier material layer 122 includes performing a chemical vapor deposition process, for example. A material of the gate conductive material layer 124 includes polysilicon, amorphous silicon, W, Co, Al, WSix, CoSix for example. A process of forming the gate conductive material layer 124 includes performing a chemical vapor deposition process, for example.

Figure 1F:
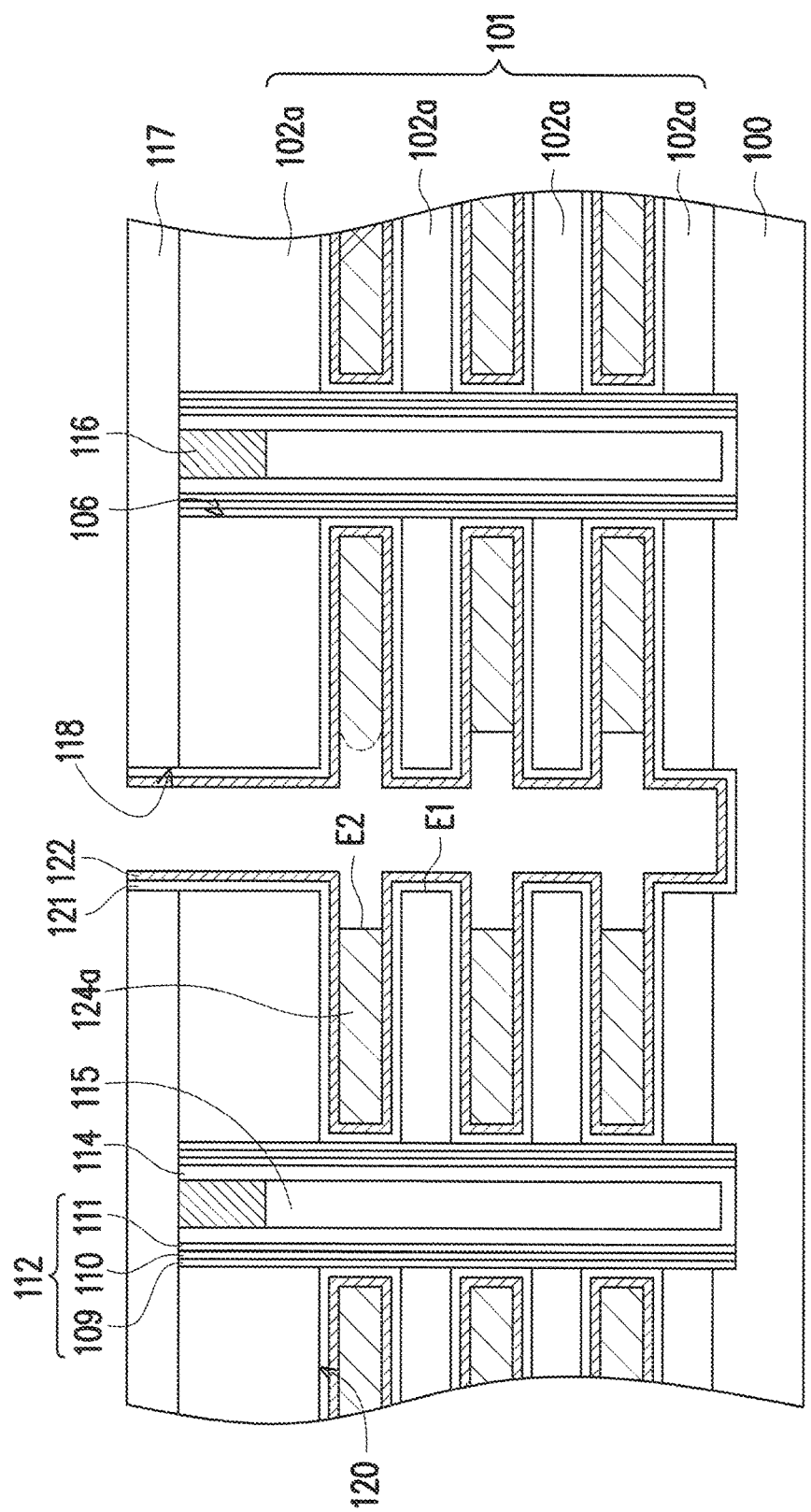
Figure 1G:
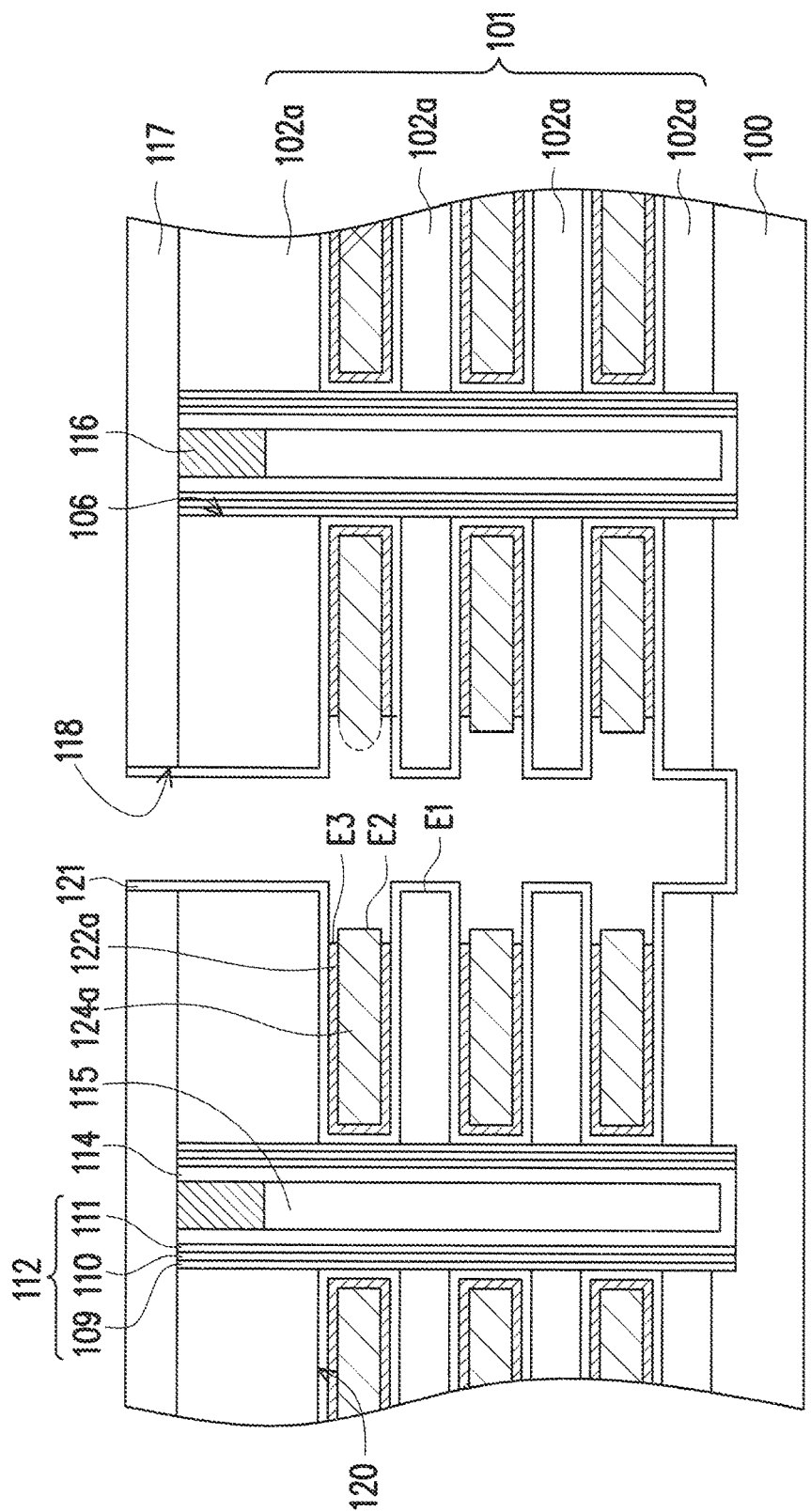
Figure 1H:
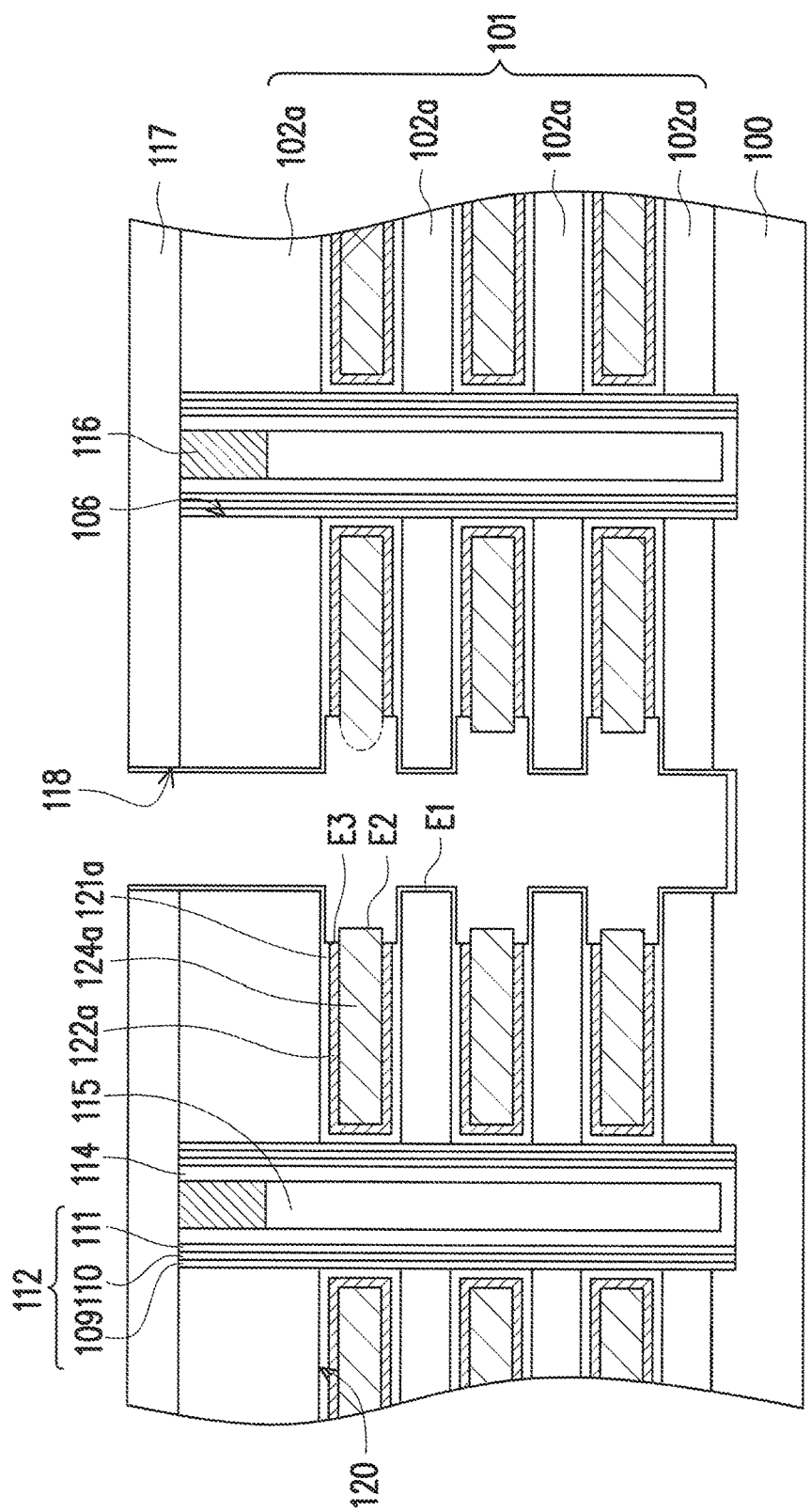
Figure 11:
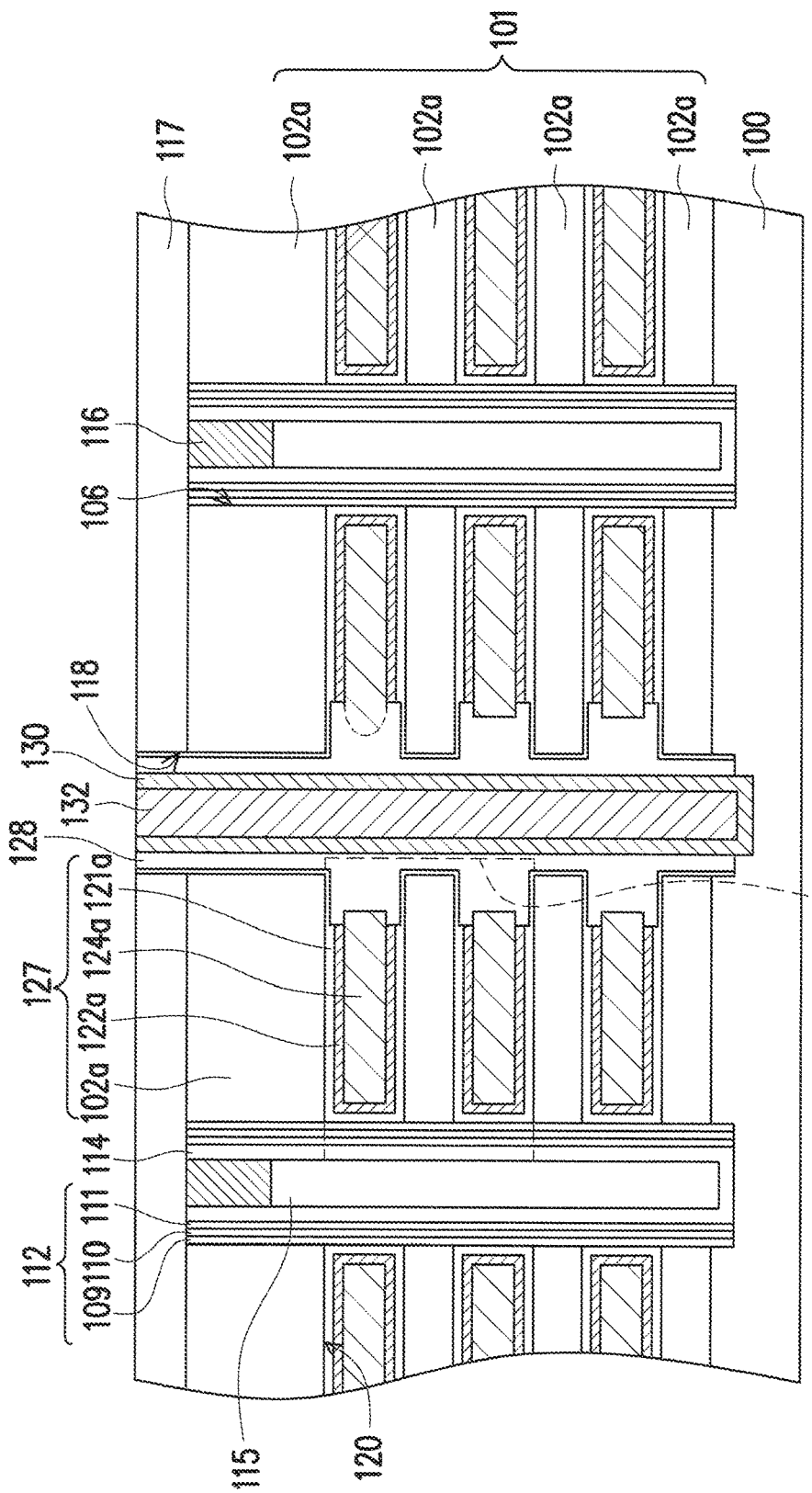

Referring to FIGS. 1F to 1H, a portion of the gate conductive material layer 124, a portion of the barrier material layer 122, and a portion of the buffer material layer 121 are removed to form gates 124a, a buffer layer 121a, and a barrier layer 122a.

In some embodiments, as shown in FIG. 1F, a first etching process is performed to remove a portion of the gate conductive material layer 124, thereby exposing the barrier material layer 122. The first etching process may include an etch back process, such as a wet etching process or a dry etching process. Either dry etching process or wet etching process is feasible. In some embodiments, dry etching process can be conducted under plasma systems, including inductively coupled plasma (ICP), remote plasma, capacitive coupled plasma (CCP), or electron cyclotron resonance (ECR) systems. And the fluorine-based chemicals such as $NF_3$, $SF_6$, or $CF_4$ can be applied, for example. In some embodiments, the $NH_4OH$, $H_2O_2$, $H_2SO_4$, $HNO_3$, or acetic acid can be applied in the case of wet etching. In some embodiments, during the first etching process, a portion of the gate conductive material layer 124 in the sideway openings 120 may also be removed in addition to removing the gate conductive material layer 124 in the opening 118. Moreover, after performing the first etching process on the gate conductive material layer 124, remaining of the gate conductive material layer 124 forms the gates 124a. In some embodiments, the gates 124a may serve as word lines. In some embodiments, an end E1 of the insulating layer 102a is convex with respect to an end E2 of the gate 124a exposed in the sideway opening 120. Specifically, the end E1 of the insulating layer 102a is convex with respect to the end E2 of the gate 124a in a direction away from the channel layer 114. In the embodiment, two adjacent gates 124a are isolated from each other by the insulating layer 102a located between the adjacent gates 124a. In addition, since the insulating layer 102a is convex with respect to the gates 124a in the adjacent (upper and lower) sideway openings 120, the adjacent gates 124a may be prevented from contacting each other. In the embodiment, the end E2 of the gate 124a has a substantially flat surface. However, the invention is not limited thereto. In some other embodiments, the end E2 of the gate 124a has an arc-like surface. In some embodiments, a surface of the end E2 of the gate 124a closer to a center of the opening 120 is convex (as indicated by a broken line) with respect to a surface of the end E2 of the gate 124a closer to an edge of the opening 120 (i.e., closer to the barrier material layer 122).

Then, referring to FIG. 1G, a second etching process is performed to remove a portion of the barrier material layer 122, thereby exposing the buffer material layer 121. The second etching process includes a dry etching process or a wet etching process, for example. In some embodiments, during the second etching process, the barrier material layer 122 exposed by the sideway openings 120 and a portion of the barrier material layer 122 between the gates 124a and the buffer material layer 121 may also be removed in addition to removing the barrier material layer 122 on the opening 118. After performing the second etching process on the barrier material layer 122, remaining of the barrier material layer 122 forms the barrier layer 122a. In some embodiments, the end E2 of the gate 124a exposed in the sideway opening 120 is convex with respect to an end E3 of the barrier layer 122a exposed in the sideway opening 120. Specifically, the end E2 of the gate 124a is convex with respect to the end E3 of the barrier layer 122a in the direction away from the channel layer 114. In the embodiment, by removing the barrier material layer 122 on the opening 118 and even removing the barrier material layer 122 in the sideway openings 120 to an extent of being lower than the end E2 of the gate 124a, isolation between the gates 124a in the adjacent sideway openings 120 is reinforced, and a stringer (i.e., a residual of the barrier material layer) between the adjacent sideway openings 120 is also reduced. In the embodiment, the end E3 of the barrier layer 122a has a substantially flat surface. However, the invention is not limited thereto. In some other embodiments, the end E3 of the barrier layer 122a has an inclined surface. Specifically, the end E3 of the barrier layer 122a has a surface inclined from a contact point with the buffer material layer 121 toward the channel layer 114.

In some other embodiments, a portion of the gate conductive material layer 124 and a portion of the barrier material layer 122 may be removed simultaneously by a single etch process.

Then, referring to FIG. 1H, a third etching process is performed to remove a portion of the exposed buffer material layer 121, thereby forming the buffer layer 121a. In some embodiments, the third etching process may include alternately performing a dry process and a wet process. The dry process includes a plasma process, for example. In some other embodiments, dry etching process can be conducted under plasma systems, including inductively coupled plasma (ICP), remote plasma, capacitive coupled plasma (CCP), or electron cyclotron resonance (ECR) systems. In some embodiments, oxidation gas, inert gas or a combination thereof may be adopted for the plasma process. The oxidation gas may react less with a semiconductor material and gate material. The oxidation gas may be oxygen. The inert gas may be nitrogen, krypton, or argon In some embodiments, the wet process includes a wet process with a fluorine-containing solvent, such as diluted hydrofluoric acid (DHF), buffered oxide etch (BOE) as an etchant. However, the invention is not limited thereto. Some other etchants may also be adopted for the wet process. In some embodiments, during the third etching process, a portion of the buffer material layer 121 exposed in the sideway openings 120 may also be removed in addition to removing a portion of the buffer material layer 121 on the opening 118. Specifically, after performing the dry process on the exposed buffer material layer 121, a surface of the buffer material layer 121 after the dry process becomes looser or more amorphous than that of the buffer material layer 121 without the plasma process. Then, a wet process is performed on the buffer material layer 121 after the dry process to remove a portion of the buffer material layer 121.

It should be noted that, in a conventional, process performed to reduce interferences between gates, while the barrier material layer between the gates may be removed to reduce the stringer (i.e., a residual of the barrier material layer) between the adjacent gates, a small amount of the stringer may still be embedded in a surface of the buffer material layer contacting the barrier material layer. Such stringer may easily result in a leakage path and a gate bridge and consequently render the interferences between the gates and a short circuit. However, in the embodiments of the invention, by performing the third etching process on the exposed buffer material layer, a portion of the buffer material layer and the stringer in the buffer material layer are removed together.

In some embodiments, the dry process and the wet process may be alternately and repetitively performed until the stringer in the exposed buffer material layer 121 is completely removed. Then, after performing the third etching process on the exposed buffer material layer 121, remaining of the buffer material layer 121 forms the buffer layer 121a. In some embodiments, each alternately dry process and wet process can remove the gate 124a, barrier layer 122a and buffer layer 121a in an amount greater than 1 Å.

In some embodiments, as shown in FIG. 1H, after performing the third etching process on the exposed buffer material layer 121, the buffer layer 121a formed accordingly still covers the surfaces of the insulating layers 102a continuously. In some embodiments, after performing the third etching process on the exposed buffer material layer 121, the buffer layer 121a formed accordingly covers the surfaces of the insulating layers 102a discontinuously. In some other embodiments, after performing the third etching process on the exposed buffer material layer 121, the buffer layer 121a formed accordingly exposes corners (not shown) of the insulating layers 102a, thereby blocking a physical connection between metals/metal oxides.

Referring to FIG. 1I, an insulating layer 128 is formed covering the sidewalls of the openings 118 and filling the sideway openings 120. In some embodiments, a material of the insulating layer 128 includes silicon oxide, for example. A process of forming the insulating layer 128 includes performing a chemical vapor deposition process or an atomic layer deposition (ALD) process, for example. Then, an etch process is applied to remove the insulating layer 128 at the bottom of the openings 118. In some other embodiments, after performing the etch process on the insulating layer 128, a portion of the substrate 100 may be optionally removed. A barrier layer 130, and a metal layer 132 are sequentially filled into the opening 118. A material of the barrier layer 130 includes Ti, TiN, Ta, TaN, or a combination thereof, for example. A process of forming the barrier layer 130 includes performing a chemical vapor deposition process, for example. A material of the metal layer 132 includes tungsten (W), polysilicon (poly-Si), cobalt (Co), WSix, CoSix, for example. A process of forming the metal layer 132 includes performing a chemical vapor deposition process, for example. In some embodiments, the metal layer 132 may serve as a common source line. Accordingly, manufacturing of the three-dimensional non-volatile memory according to the embodiment of the invention is completed.

Figure 3:
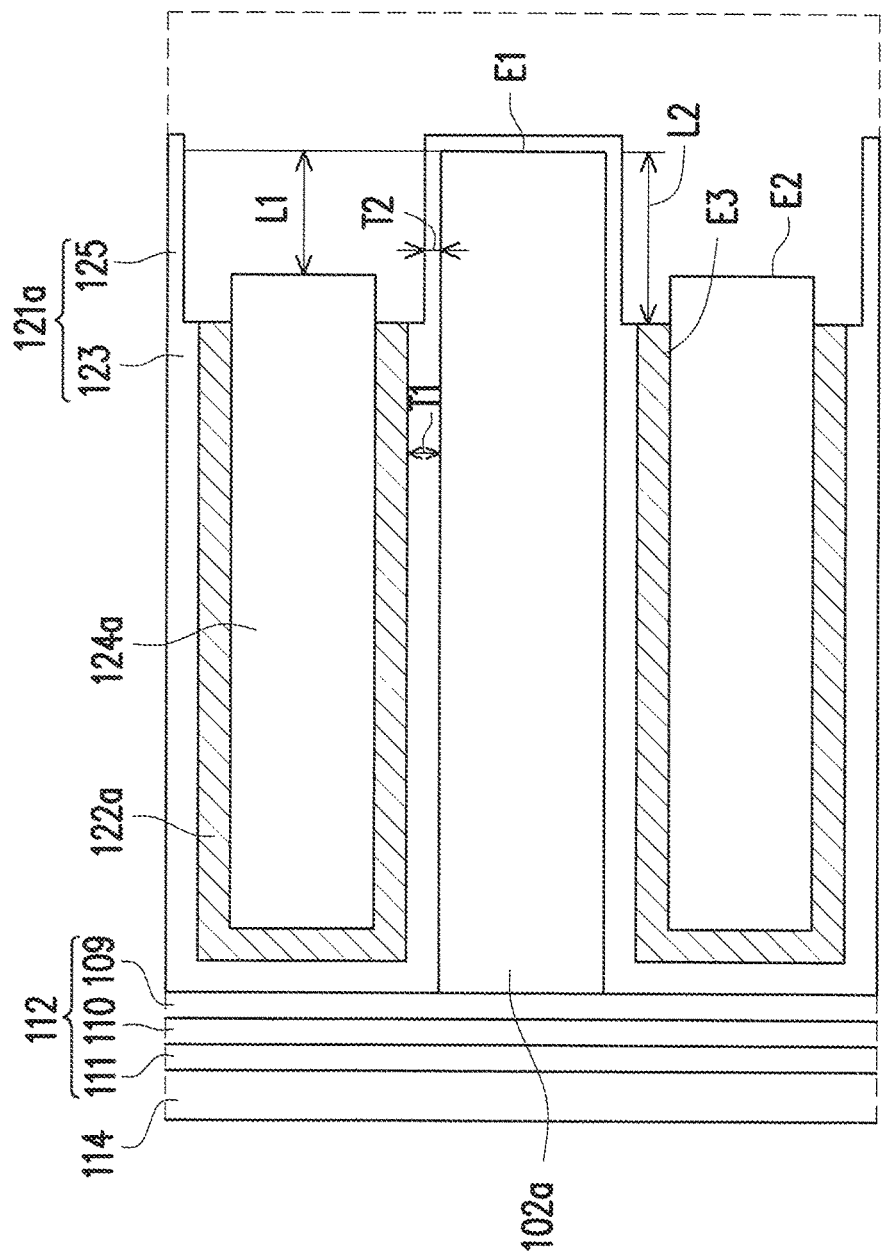
FIG. 3 is a partial enlarged view of a region A of FIG. 1I.
Figure 4:
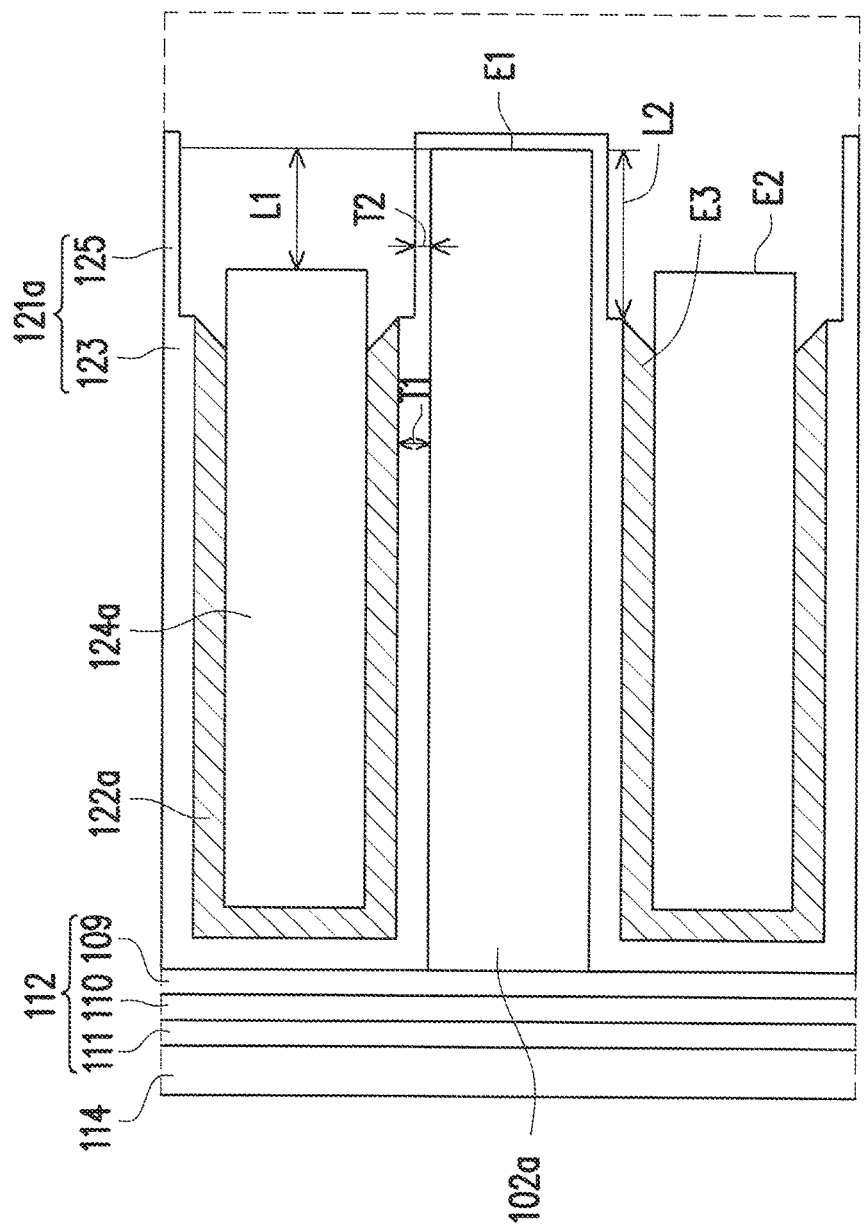
FIG. 4 is a partial enlarged view of a region A of another embodiment.

In the following, a structure of the three-dimensional non-volatile memory according to the embodiment of the invention is described with reference to FIG. 1I. Besides, while the manufacturing method of the three-dimensional non-volatile memory according to the embodiment is described by taking the above processes as an example, the method of forming the three-dimensional non-volatile memory according to the embodiments of the invention is not limited thereto. FIG. 3 is a partial enlarged view of a region A of FIG. 1I. FIG. 4 is a partial enlarged view of a region A of another embodiment.

Referring to FIG. 1I, FIG. 3 and FIG. 4, the three-dimensional non-volatile memory includes the substrate 100, the charge storage structure 112, the stacked structure 127, and the channel layer 114. The stacked structure 127 and the charge storage structure 112 are disposed on the substrate 110, and the stacked structure 127 is disposed at a side of the charge storage structure 112. The stacked structure 127 includes the insulating layers 102a, the gates 124a, the buffer layer 121a, and the barrier layer 122a. The insulating layers 102a and the gates 124 are alternately stacked. The buffer layer 121a is disposed between each of the gates 124a and the charge storage structure 112 and on the surfaces of the insulating layers 102a. The barrier layer 122a is disposed between each of the gates 124a and the buffer layer 121a. The channel layer 114 is disposed on the charge storage structure 112.

In some embodiments, the end E2 of the gate 124a is convex with respect to the end E3 of the barrier layer 122a in the direction away from the channel layer 114. In some embodiments, a distance from the end E1 of the insulating layer 102a to the end E2 of the gate 124a in a direction perpendicular to the channel layer 114 is L1, a distance from the end E1 of the insulating layer 102a to the end E3 of the barrier layer 122a in a direction perpendicular to the channel layer 114 is L2, and 1<L2/L1<2. In some other embodiments, the end E3 of the barrier layer 122a has an inclined surface. Specifically, the end E3 of the barrier layer 122a has a surface inclined from a contact point with the buffer material layer 121 toward the channel layer 114, as shown in FIG. 4. In this case, a distance from the E1 of the insulating layer 102a to the contact point of the end E3 with the buffer material layer 121 in a direction perpendicular to the channel layer is L2.

In some embodiments, the buffer layer 121a includes a first portion 123 contacting the barrier layer 122a and a second portion 125 not contacting the barrier layer 122a. In addition, a thickness of the first portion 123 of the buffer layer 121a is T1, a thickness of the second portion 125 of the buffer layer 121a is T2, and 0<T1−T2 30 Å. In some embodiments, the second portion 125 of the buffer layer 121a is discontinuous. Specifically, the buffer layer 121a formed accordingly exposes corners (not shown) of the insulating layers 102a, thereby blocking a physical connection between metals/metal oxides.

In some embodiments, an atomic concentration of atoms of the buffer layer 121a contained in the second portion 125 of the buffer layer 121a is less than 1 at %.

In some embodiments, the three-dimensional non-volatile memory may further include the dielectric layer 115 and the conductive plug 116. The dielectric layer 115 is located at a lower part of the opening 106, and the channel layer 114 surrounds the dielectric layer 115. The conductive plug 116 is located at an upper part of the opening 116 and contacts the channel layer 114.

In view of the foregoing, in the three-dimensional non-volatile memory and the manufacturing method of the three-dimensional non-volatile memory according to the embodiments, a portion of the insulating layer between the gates and the stringer in the insulating layer are removed together to reduce the interferences between the gates and a short circuit during operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A three-dimensional non-volatile memory, comprising:
   a substrate;
   a charge storage structure, disposed on the substrate;
   a stacked structure, disposed at a side of the charge storage structure and comprising:
   a plurality of insulating layers and a plurality of gates, wherein the insulating layers and the gates are alternately stacked;
   a buffer layer, disposed between each of the gates and the charge storage structure and on surfaces of the insulating layers; and
   a barrier layer, disposed between each of the gates and the buffer layer; and
   a channel layer, disposed at another side of the charge storage structure,
   wherein an end of the gate is convex relative to an end of the barrier layer in a direction away from the channel layer,
   wherein the buffer layer comprises a first portion contacting the barrier layer and a second portion not contacting the barrier layer, and a thickness of the second portion is less than a thickness of the first portion.

2. The three-dimensional non-volatile memory as claimed in claim 1, wherein a distance from an end of the insulating layer to the end of the gate in a direction perpendicular to the channel layer is L1, a distance from the end of the insulating layer to the end of the barrier layer in a direction perpendicular to the channel layer is L2, and 1<L2/L1<2.

3. The three-dimensional non-volatile memory as claimed in claim 1, wherein the thickness of the first portion of the buffer layer contacting the barrier layer is T1, the thickness of the second portion of the buffer layer not contacting the barrier layer is T2, and 0<T1−T2≤30 Å.

4. The three-dimensional non-volatile memory as claimed in claim 3, wherein the second portion of the buffer layer is discontinuous.

5. The three-dimensional non-volatile memory as claimed in claim 3, wherein an atomic concentration of atoms of the barrier layer contained in the second portion is less than 1 at %.

6. The three-dimensional non-volatile memory as claimed in claim 1, wherein a material of the barrier layer comprises Ti, TiN, Ta, TaN, or a combination thereof.

7. The three-dimensional non-volatile memory as claimed in claim 1, wherein a material of the buffer layer comprises a high-k material.

8. A manufacturing method of a three-dimensional non-volatile memory, comprising:
   forming a charge storage structure and a stacked structure on a substrate, wherein the charge storage structure is disposed on a sidewall of the stacked structure, and the stacked structure comprises:
   a plurality of insulating layers and a plurality of gates, wherein the insulating layers and the gates are alternately stacked;
   a buffer layer, disposed between each of the gates and the charge storage structure and on surfaces of the insulating layers; and
   a barrier layer, disposed between each of the gates and the buffer layer; and
   forming a channel layer on the charge storage structure,
   wherein an end of the gate is convex relative to an end of the barrier layer in a direction away from the channel layer,
   wherein the buffer layer comprises a first portion contacting the barrier layer and a second portion not contacting the barrier layer, and a thickness of the second portion is less than a thickness of the first portion.

9. The manufacturing method of the three-dimensional non-volatile memory as claimed in claim 8, wherein a distance from the end of the insulating layer to the end of the gate in a direction perpendicular to the channel layer is L1, a distance from the end of the insulating layer to the end of the barrier layer in a direction perpendicular to the channel layer is L2, and 1<L2/L1<2.

10. The manufacturing method of the three-dimensional non-volatile memory as claimed in claim 8, wherein the thickness of the first portion of the buffer layer contacting the barrier layer is T1, the thickness of the second portion of the buffer layer not contacting the barrier layer is T2, and 0<T1−T2≤30 Å.

11. The manufacturing method of the three-dimensional non-volatile memory as claimed in claim 10, wherein the second portion of the buffer layer is discontinuous.

12. The manufacturing method of the three-dimensional non-volatile memory as claimed in claim 10, wherein an atomic concentration of atoms of the buffer layer contained in the second portion is less than 1 at %.

13. The manufacturing method of the three-dimensional non-volatile memory as claimed in claim 8, wherein the step of forming the stacked structure comprises:

forming a plurality of insulating material layers and a plurality of sacrifice layers alternately stacked on the substrate;
 performing a patterning process on the insulating material layers and the sacrifice layers to form a first opening;
 removing the sacrifice layers exposed by the first opening to form a second opening exposing a portion of the charge storage structure;
 forming a gate layer on a surface of the first opening and filling the gate layer into the second opening, wherein the gate layer comprises a buffer material layer, a barrier material layer, and a gate material layer sequentially formed; and
 removing a portion of the gate material layer, a portion of the buffer material layer, and a portion of the barrier material layer to form the gates, the buffer layer, and the barrier layer.

14. The manufacturing method of the three-dimensional non-volatile memory as claimed in claim 13, wherein the step of removing the portion of the gate material layer, the portion of the buffer material layer, and the portion of the barrier material layer comprises:

performing a first etching process to remove the portion of the gate material layer, thereby exposing the barrier material layer;
 performing a second etching process to remove the portion of the barrier material layer, thereby exposing the buffer material layer; and
 performing a third etching process to remove the portion of the buffer material layer, thereby forming the buffer layer.

15. The manufacturing method of the three-dimensional non-volatile memory as claimed in claim 14, wherein the first etching process comprises an etch back process.

16. The manufacturing method of the three-dimensional non-volatile memory as claimed in claim 14, wherein the second etching process comprises a dry etching process or a wet etching process.

17. The manufacturing method of the three-dimensional non-volatile memory as claimed in claim 14, wherein the third etching process comprises alternately performing a dry process and a wet process.

18. The manufacturing method of the three-dimensional non-volatile memory as claimed in claim 17, wherein the dry process comprises a plasma process.

19. The manufacturing method of the three-dimensional non-volatile memory as claimed in claim 17, wherein the wet process comprises a wet process with a fluorine-containing solvent as an etchant.

\* \* \* \* \*